United States Patent
Cho et al.

(10) Patent No.: US 7,268,839 B2
(45) Date of Patent: Sep. 11, 2007

(54) ARRAY SUBSTRATE COMPRISING AN ISLAND SHAPED DRAIN ELECTRODE ENCLOSED BY THE SOURCE ELECTRODE AND LIQUID CRYSTAL DISPLAY DEVICE INCLUDING THE SAME

(75) Inventors: So-Haeng Cho, Annyang-si (KR); Dong-Hoon Lee, Annyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/737,925

(22) Filed: Dec. 18, 2003

(65) Prior Publication Data
US 2004/0125262 A1 Jul. 1, 2004

(30) Foreign Application Priority Data
Dec. 26, 2002 (KR) ............... 10-2002-0083881

(51) Int. Cl.
*G02F 1/136* (2006.01)
*H01L 29/00* (2006.01)
*H01L 31/036* (2006.01)

(52) U.S. Cl. .................... 349/43; 257/59; 257/72
(58) Field of Classification Search .......... 349/43, 349/44, 46; 257/59, 72
See application file for complete search history.

(56) References Cited

U.S. PATENT DOCUMENTS

| | | | |
|---|---|---|---|
| 5,055,899 A * | 10/1991 | Wakai et al. .................. 257/61 |
| 5,414,283 A * | 5/1995 | den Boer et al. .............. 257/59 |
| 5,528,396 A * | 6/1996 | Someya et al. ................ 349/43 |
| 5,668,649 A * | 9/1997 | Suzuki et al. .................. 349/42 |
| 5,838,400 A * | 11/1998 | Ueda et al. .................... 349/58 |
| 6,147,722 A * | 11/2000 | Shimada et al. .............. 349/43 |
| 6,707,107 B2 * | 3/2004 | Kido ........................... 257/354 |
| 6,738,110 B2 * | 5/2004 | Lee .............................. 349/46 |
| 2001/0011728 A1 * | 8/2001 | Gu et al. ....................... 257/72 |
| 2002/0097364 A1 * | 7/2002 | kwon et al. ................. 349/139 |

FOREIGN PATENT DOCUMENTS

| JP | 2000-193956 | 7/2000 |
|---|---|---|
| JP | 2001-013502 | 1/2001 |

OTHER PUBLICATIONS

Communication from Korean Patent Office dated May 30, 2005.

* cited by examiner

*Primary Examiner*—Andrew Schechter
*Assistant Examiner*—W. Patty Chen
(74) *Attorney, Agent, or Firm*—McKenna Long & Aldridge LLP

(57) ABSTRACT

An array substrate for a liquid crystal display device including a substrate, a gate electrode on the substrate, a first insulating layer on the gate electrode, an active layer on the first insulating layer and corresponding to the gate electrode, a source electrode over the active layer and overlapping an edge of the active layer, a drain electrode over the active layer and having an island shape, wherein the drain electrode entirely overlaps the gate electrode, a second insulating layer on the source and drain electrodes, and including a drain contact hole exposing the drain electrode, and a pixel electrode over the second insulating layer and connected to the drain electrode.

11 Claims, 5 Drawing Sheets

ARRAY SUBSTRATE COMPRISING AN ISLAND SHAPED DRAIN ELECTRODE ENCLOSED BY THE SOURCE ELECTRODE AND LIQUID CRYSTAL DISPLAY DEVICE INCLUDING THE SAME

This application claims the benefit of Korean Application No. P2002-083881 filed on Dec. 26, 2002, which is hereby incorporated by reference for all purposes as if fully set forth herein.

BACKGROUND OF THE INVENTION

1. Field of the Invention

The present invention relates to a liquid crystal display device, and more particularly, to an array substrate and the liquid crystal display device including the same.

2. Discussion of the Related Art

A cathode ray tube has been widely used as a display device such as a television and a computer monitor. However, the cathode ray tube has a large size, heavy weight, and high driving voltage. Therefore, flat panel displays that are thin, light weight, and low in power consumption have been in demand. Among these devices, the liquid crystal display (LCD) device has been widely developed because of its superior resolution, color image display, and image quality.

The LCD device includes an array substrate, a color filter substrate and a liquid crystal layer interposed therebetween. The LCD device displays images by using differences in refractive indices of light due to the anisotropy of liquid crystal.

An LCD device including thin film transistors and pixel electrodes of a matrix form, which is referred to as an active matrix LCD (AM-LCD) device, is widely used due to its high resolution and fast moving images. In the AM-LCD device, the thin film transistor functions as a switching element that controls voltage applied to the liquid crystal layer in a pixel and changes the transmittance of light in the pixel.

The thin film transistor for the AM-LCD device will be described in detail with reference to the attached drawings.

FIG. 1 is a schematic plan view of an array substrate for a liquid crystal display device according to the related art and shows a thin film transistor as a main part. As shown in FIG. 1, a gate line 10, is formed in a first direction and a data line 40, crossing the gate line 10 is formed in a second direction to define a pixel area. A gate electrode 12 is connected to the gate line 10, and an active layer 30, which is made of amorphous silicon, is formed on the gate electrode 12. Although not shown in the figure, a gate insulating layer is formed between the gate electrode 12 and the active layer 30. A source electrode 42a, which is connected to the data line 40, overlaps the edge of the active layer 30 in part and a drain electrode 42b, which is enclosed by the source electrode 42a, is disposed on a central portion of the active layer 30. The drain electrode 42b is connected to a drain extended portion 42c, which is formed in the pixel area. The gate electrode 12, the source electrode 42a and the drain electrode 42b constitute a thin film transistor.

A passivation layer (not shown) is formed on the source and drain electrodes 42a and 42b, and the passivation layer includes a drain contact hole 52 exposing the drain extended portion 42c. A pixel electrode 60 is formed on the passivation layer and is connected to the drain extended portion 42c through the drain contact hole 52.

In the thin film transistor, since the gate electrode 12 overlaps the source and drain electrodes 42a and 42b with definite widths, first and second parasitic capacitors Cgs and Cgd are formed.

When a channel is generated in the active layer 30 by voltage applied to the gate electrode 12, the thin film transistor functions as a switching element by permitting currents to flow through the channel. If the gate electrode 12 overlaps the source and drain electrodes 42a and 42b to form the parasitic capacitors Cgs and Cgd, many problems may occur because the parasitic capacitors Cgs and Cgd are connected to the gate electrode 12 in parallel. That is, the parasitic capacitors Cgs and Cgd may delay signals applied to the gate electrode 12 or may change the threshold voltage of the thin film transistor. Therefore, it is beneficial that values of the parasitic capacitors Cgs and Cgd are minimized.

The structure of the thin film transistor and the parasitic capacitors will be described in detail with reference to FIG. 2. FIG. 2 is a schematic cross-sectional view along the line II-II' of FIG. 1.

As shown in FIG. 2, a gate electrode 12 is formed on a substrate 1 and a gate insulating layer 20 is formed on the entire surface of the substrate 1 covering the gate electrode 12. An active layer 30 of amorphous silicon is formed on the gate insulating layer 20 corresponding to the gate electrode 12. A source electrode 42a and a drain electrode 42b, which are facing and spaced apart from each other, are formed over the active layer 30. The source electrode 42a is connected to a data line 40 and the drain electrode 42b is connected to a drain extended portion 42c. As stated above, the gate electrode 12, the source electrode 42a and the drain electrode 42b constitute a thin film transistor.

A passivation layer 50 covering the source and drain electrodes 42a and 42b is formed on the entire surface of the substrate 1. The passivation layer 50 has a drain contact hole 52. A pixel electrode 60 is formed on the passivation layer 50 and is connected to the drain extended portion 42c.

In the thin film transistor, the source and drain electrodes 42a and 42b overlap the gate electrode 12 in fixed portions, and the overlapping portions become first and second parasitic capacitors Cgs and Cgd, respectively. The first and second parasitic capacitors Cgs and Cgd negatively effect the characteristics of the thin film transistor and decrease the image quality of the liquid crystal display device. Thus, it is beneficial that values of the first and second parasitic capacitors Cgs and Cgd are minimized.

In addition, the drain electrode 42b may be misaligned with respect to the gate electrode 12 when the drain electrode 42b is formed. This means that a size of the drain electrode 42b overlapping the gate electrode 12 may change, and cause variation of the second parasitic capacitor Cgd.

More particularly, when misalignment occurs, a length l of the drain electrode 42b overlapping the gate electrode 12 may increase or decrease by Δl. Therefore, the size of the drain electrode 42b overlapping the gate electrode 12, and a parasitic capacitance Cpara of the second parasitic capacitor Cgd also includes a parasitic capacitance deviation ΔCpara, which may be a positive value or a negative value. The parasitic capacitance deviation ΔCpara may interfere with data signals that are applied to the pixel electrode 60 through the data line 40 and cause problems such as flicker to get worse.

SUMMARY OF THE INVENTION

Accordingly, the present invention is directed to an array substrate and a liquid crystal display device including the same that substantially obviates one or more of the problems due to limitations and disadvantages of the related art.

An advantage of the present invention is to provide an array substrate including a thin film transistor that minimizes [[the]] parasitic capacitance deviation.

Another advantage of the present invention is to provide a liquid crystal display device including a thin film transistor that reduces flicker.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes a substrate, a gate electrode on the substrate, a first insulating layer on the gate electrode, an active layer on the first insulating layer and corresponding to the gate electrode, a source electrode over the active layer and overlapping an edge of the active layer and forming a first parasitic capacitance between the source electrode and the gate electrode, a drain electrode over the active layer and having an island shape, wherein the drain electrode entirely overlaps the gate electrode and forms a second parasitic capacitance between the drain electrode and gate electrode, a second insulating layer on the source and drain electrodes, and including a drain contact hole exposing the drain electrode, and a pixel electrode over the second insulating layer and connected to the drain electrode.

In another aspect of the present invention, a liquid crystal display device includes first and second substrates facing and spaced apart from each other, a gate electrode on an inner surface of the first substrate, a first insulating layer on the gate electrode, an active layer on the first insulating layer and corresponding to the gate electrode, a source electrode over the active layer and overlapping an edge of the active layer, a drain electrode over the active layer and having an island shape, wherein the drain electrode is entirely on the gate electrode wherein the drain electrode is spaced apart from the source electrode, a second insulating layer on the source and drain electrodes, and including a drain contact hole exposing the drain electrode, a pixel electrode over the second insulating layer and connected to the drain electrode via the drain contact hole, a black matrix on an inner surface of the second substrate, a color filter layer on the black matrix, a common electrode on the color filter layer, and a liquid crystal layer between the pixel electrode and the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiment of the present invention, an example of which is illustrated in the accompanying drawings. Wherever possible, the same reference numbers will be used throughout the drawings to refer to the same or like parts.

Figure 1:
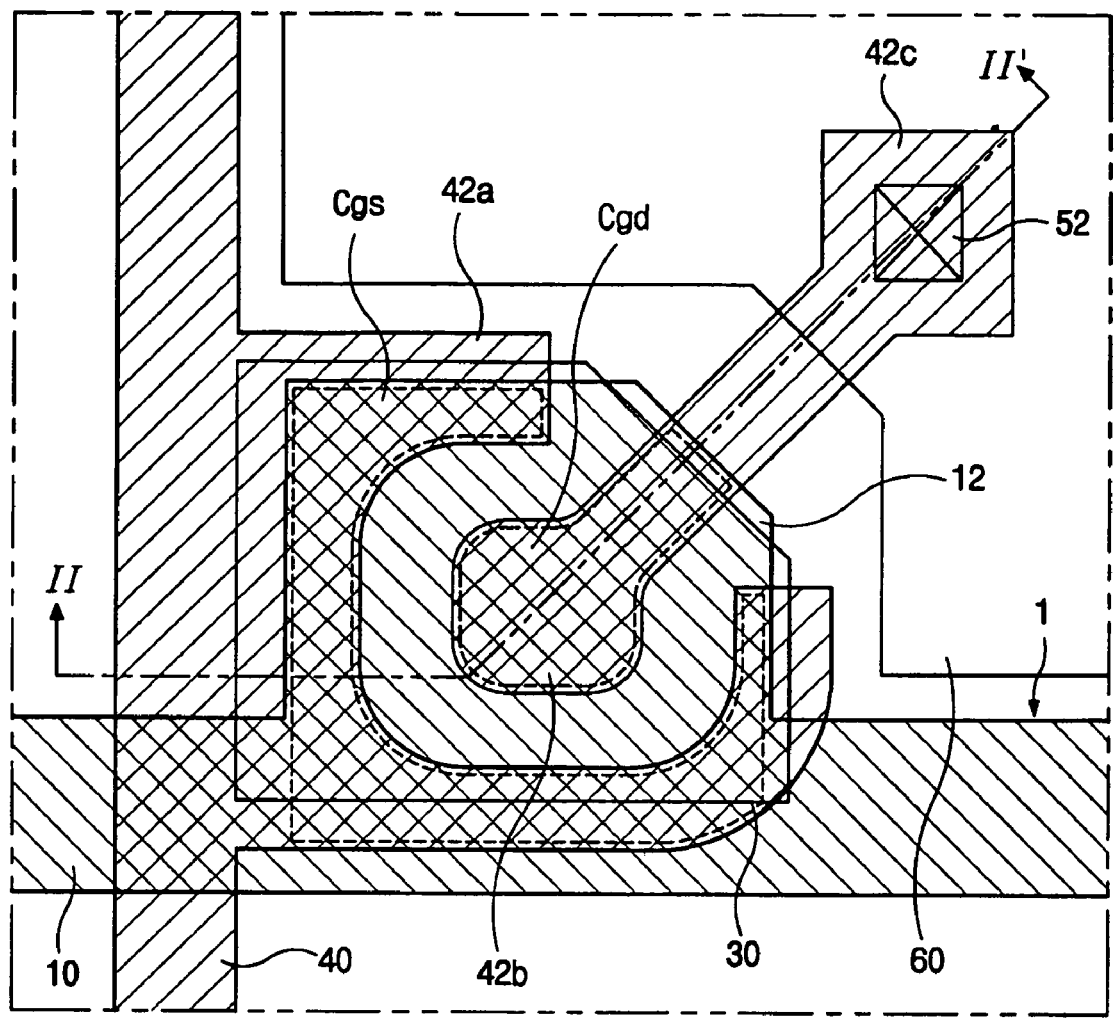
FIG. 1 is a schematic plan view of an array substrate for a liquid crystal display device according to the related art.
Figure 2:
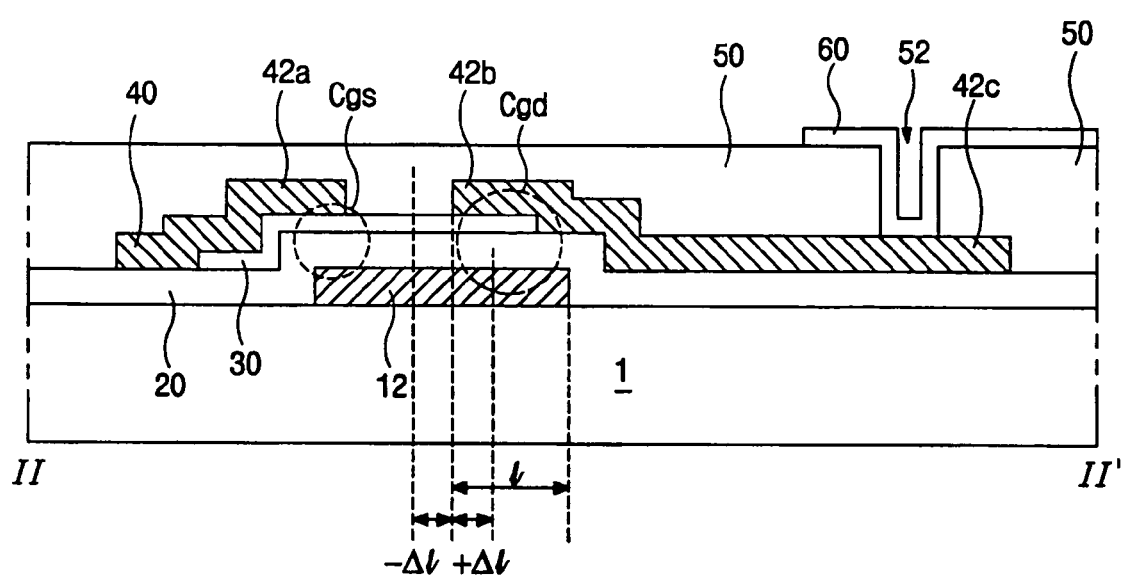
FIG. 2 is a schematic cross-sectional view along the line II-II' of FIG. 1.
Figure 3:
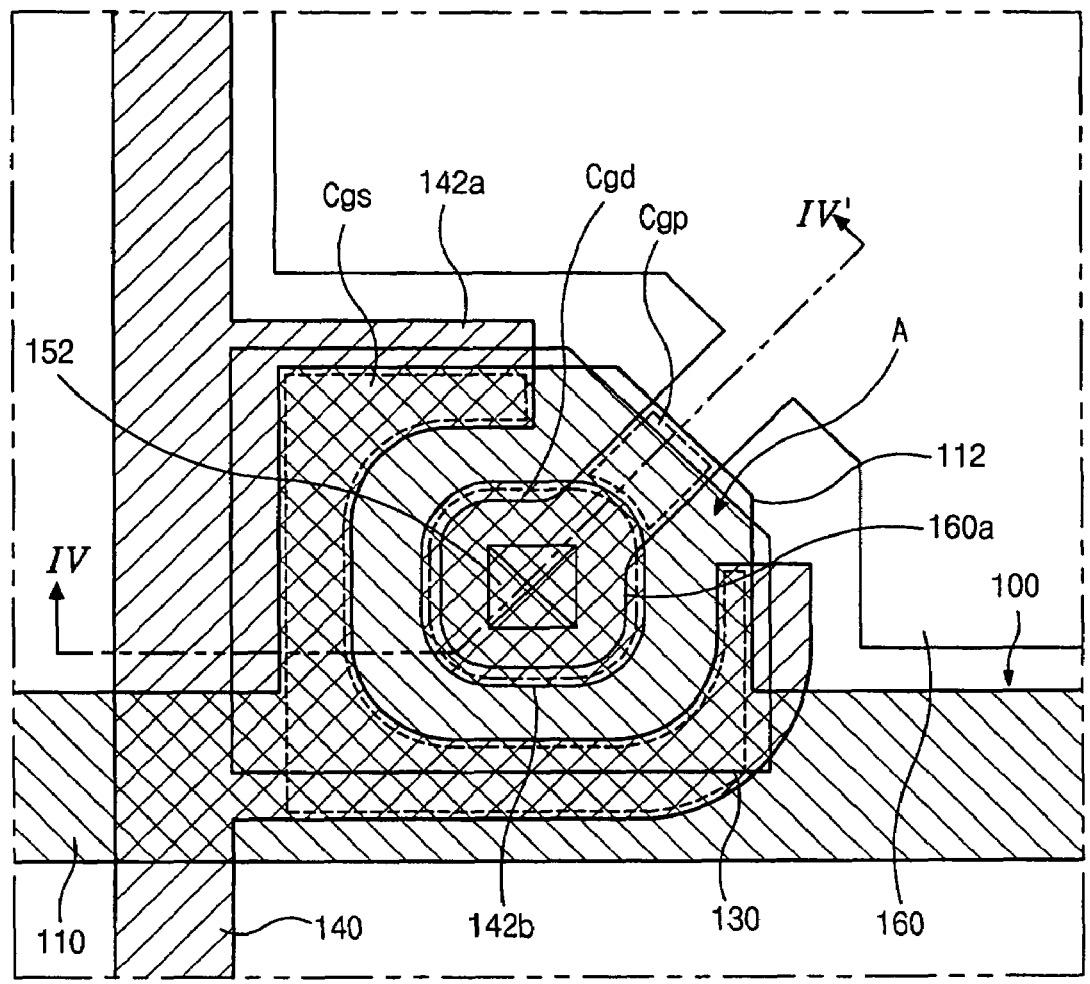
FIG. 3 is a schematic plan view of an array substrate for a liquid crystal display device according to an embodiment of the present invention.

FIG. 3 is a schematic plan view of an array substrate for a liquid crystal display device according to an embodiment of the present invention. As shown in FIG. 3, a gate line 110 is formed in a first direction on a substrate 100 and a data line 140, crossing the gate line 110, is formed in a second direction to define a pixel area. A gate electrode 112 is connected to the gate line 110, and an active layer 130, which is made of amorphous silicon, is formed on the gate electrode 112. Although not shown in the figure, a gate insulating layer may be formed between the gate electrode 112 and the active layer 130, and an ohmic contact layer may be further formed on the active layer 130 to improve contact characteristics with metal layers.

A source electrode 142a is connected to the data line 140, and overlaps the edge of the active layer 130 in part. The source electrode 142a has an opening A at a certain portion. A drain electrode 142b is enclosed by the source electrode 142a and is disposed on a central portion of the active layer 130. The drain electrode 142b has an island shape and is wholly located on the gate electrode 112. The gate electrode 112, the source electrode 142a and the drain electrode 142b constitute a thin film transistor.

A passivation layer (not shown) is formed on the source and drain electrodes 142a and 142b, and the passivation layer includes a drain contact hole 152 exposing the drain electrode 142b. A pixel electrode 160 is formed on the passivation layer at the pixel area and is electrically connected to the drain electrode 142b. That is, an extended portion 160a is extended from the pixel electrode 160, and contacts the drain electrode 142b through the drain contact hole 152. In addition, the extended portion 160a passes through the opening A of the source electrode 142a and does not overlap the source electrode 142a. Therefore, a parasitic capacitor is not formed between the source electrode 142a and the extended portion 160a.

In the thin film transistor, the gate electrode 112 is overlapped by the source and drain electrodes 142a and 142b with definite widths, and thus first and second parasitic capacitors Cgs and Cgd are formed. Moreover, a third parasitic capacitor Cgp is formed because the gate electrode 112 is overlapped by the extended portion 160a.

In the present invention, since not only the gate insulating layer (not shown) and the active layer 130, but also the passivation layer are interposed between the gate electrode 112 and the extended portion 160a and function as a dielectric substance of a capacitor, the third parasitic capacitor Cgp has a smaller parasitic capacitance as compared with the first and second parasitic capacitors Cgs and Cgd. Additionally, the drain electrode 142b, which constitutes the second parasitic capacitor Cgd, entirely overlaps the gate electrode 112. Thus, although the drain electrode 142b may be misaligned, the parasitic capacitance of the second parasitic capacitor Cgd is unchanged. That is, a parasitic capacitance deviation ΔCpara caused by misalignment may be decreased.

Accordingly, in the thin film transistor for a liquid crystal display device of the present invention, since the parasitic capacitances and the parasitic capacitance deviation are decreased, problems including flicker are reduced and the image quality of the liquid crystal display device is improved.

This reduction of the parasitic capacitances and the parasitic capacitance deviation will be explained in detail with reference to the attached drawings.

Figure 4:
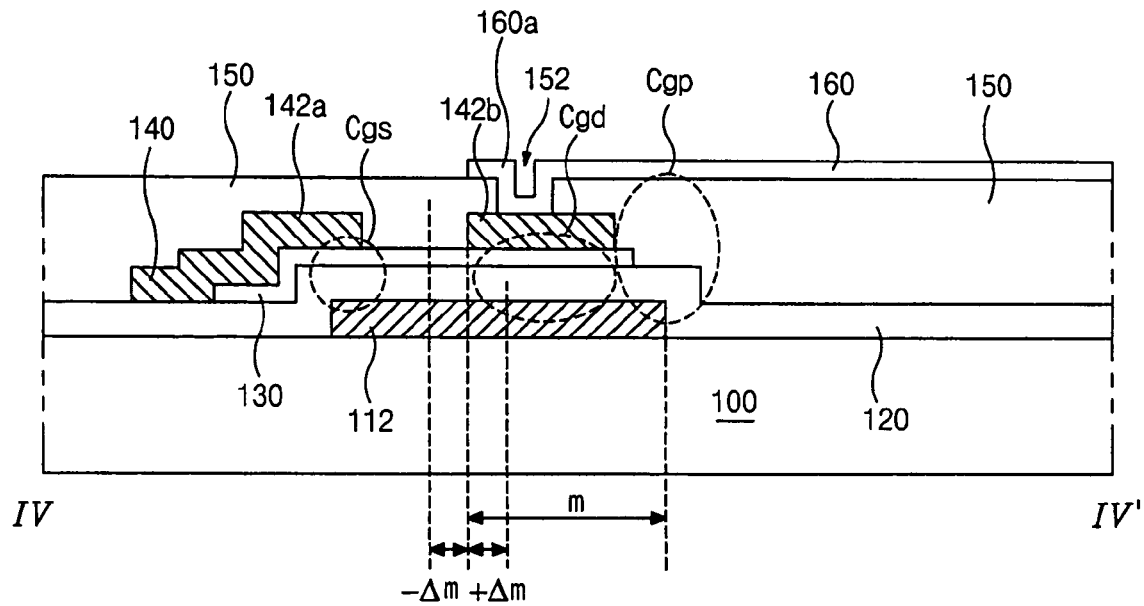
FIG. 4 is a schematic cross-sectional view along the line IV-IV' of FIG. 3.
Figure 5:
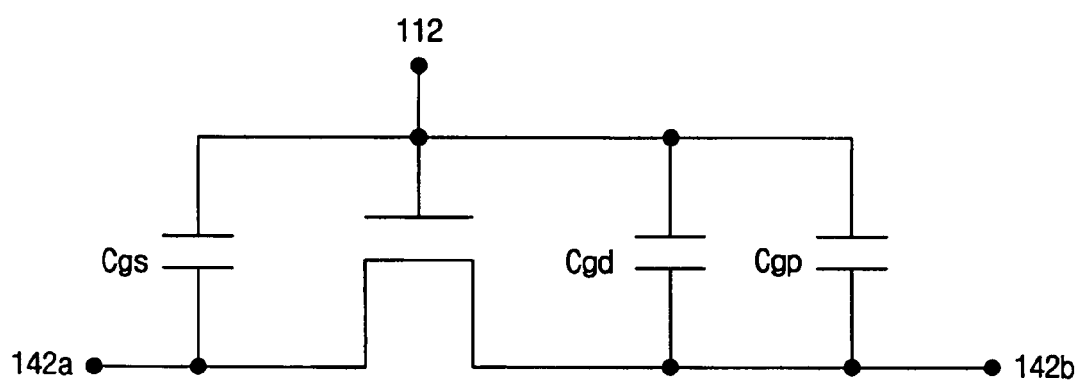
FIG. 5 is an equivalent circuit diagram for FIG. 4.

FIG. 4 is a schematic cross-sectional view along the line IV-IV' of FIG. 3 and FIG. 5 is an equivalent circuit diagram for FIG. 4.

As shown in FIG. 4, a gate electrode 112 is formed on a substrate 100 and a gate insulating layer 120 is formed on the entire surface of the substrate 100 covering the gate electrode 112. An active layer 130 of amorphous silicon is formed on the gate insulating layer 120 corresponding to the gate electrode 112. A source electrode 142a and a drain electrode 142b, which are facing and spaced apart from each other, are formed over the active layer 130. The source electrode 142a is connected to a data line 140. The drain electrode 142b has an island shape and is disposed to be wholly included on the gate electrode 112. As stated above, the gate electrode 112, the source electrode 142a and the drain electrode 142b constitute a thin film transistor.

A passivation layer 150 covering the source and drain electrodes 142a and 142b is formed on the entire surface of the substrate 100. The passivation layer 150 has a drain contact hole 152 exposing the drain electrode 142b. A pixel electrode 160 is formed on the passivation layer 150 and is connected to an extended portion 160a, which contacts the drain electrode 142b through the drain contact hole 152.

In the thin film transistor, the source and drain electrodes 142a and 142b overlap the gate electrode 112, thereby forming first and second parasitic capacitors Cgs and Cgd, and the extended portion 160a overlaps the gate electrode 112, thereby forming a third parasitic capacitor Cgp.

As shown in FIG. 5, since the first, second and third parasitic capacitors Cgs, Cgd and Cgp are connected to the gate electrode 112 in parallel, the total parasitic capacitance of the thin film transistor is expressed by the sum of the parasitic capacitances of the parasitic capacitors: Ctot=Cgs+Cgd+Cgp.

The first and second parasitic capacitors Cgs and Cgd include the gate insulating layer 120 and the active layer 130 as the dielectric substances, while the third parasitic capacitor Cgp includes the gate insulating layer 120, the active layer 130 and the passivation layer 150 as dielectric substances. Since the dielectric substance of the third parasitic capacitor Cgp has a much thicker thickness than the dielectric substances of the first and second parasitic capacitors Cgs and Cgd, the parasitic capacitance of the third parasitic capacitor Cgp is very small in comparison to the parasitic capacitances of the first and second parasitic capacitors Cgs and Cgd:Cgp<<Cgs, Cgd. Accordingly, the parasitic capacitance of the thin film transistor according to the present invention is decreased. Moreover, the passivation layer 150 may be made of benzocyclobutene (BCB), which has a relatively low dielectric constant, and in this case, the capacitance of the third parasitic capacitor Cgp becomes smaller.

Meanwhile, in FIG. 4, as the drain electrode 142b is formed in an island shape that is entirely included on the gate electrode 112, the parasitic capacitance of the second parasitic capacitor Cgd, which is formed by the gate electrode 112 and the drain electrode 142b, is unchanged even if the drain electrode 142b is misaligned.

In addition, the parasitic capacitance of the third parasitic capacitor Cgp, which is formed by the extended portion 160a and the gate electrode 112, may be changed due to misalignment of the extended portion 160a. However, since the parasitic capacitance of the third parasitic capacitor Cgp is small, the deviation of the parasitic capacitance of the third parasitic capacitor Cgp, also, is so small. That is, although the extended portion 160a is misaligned and a length m of the extended portion 160a overlapping the gate electrode 112 may be increased or decreased by Δm, the parasitic capacitance deviation ΔCgp of the third parasitic capacitor Cgp is very small in comparison with the total parasitic capacitance, i.e., ΔCgp<<Ctot. Therefore, the absolute value of the deviation of the total parasitic capacitance decreases as compared with the related art. More particularly, the absolute value of the deviation of the total parasitic capacitance of the thin film transistor according to the present invention decreases more than about 40% as compared with the related art.

Accordingly, problems including flicker are reduced and the image quality of the liquid crystal display device is improved.

Figure 6:
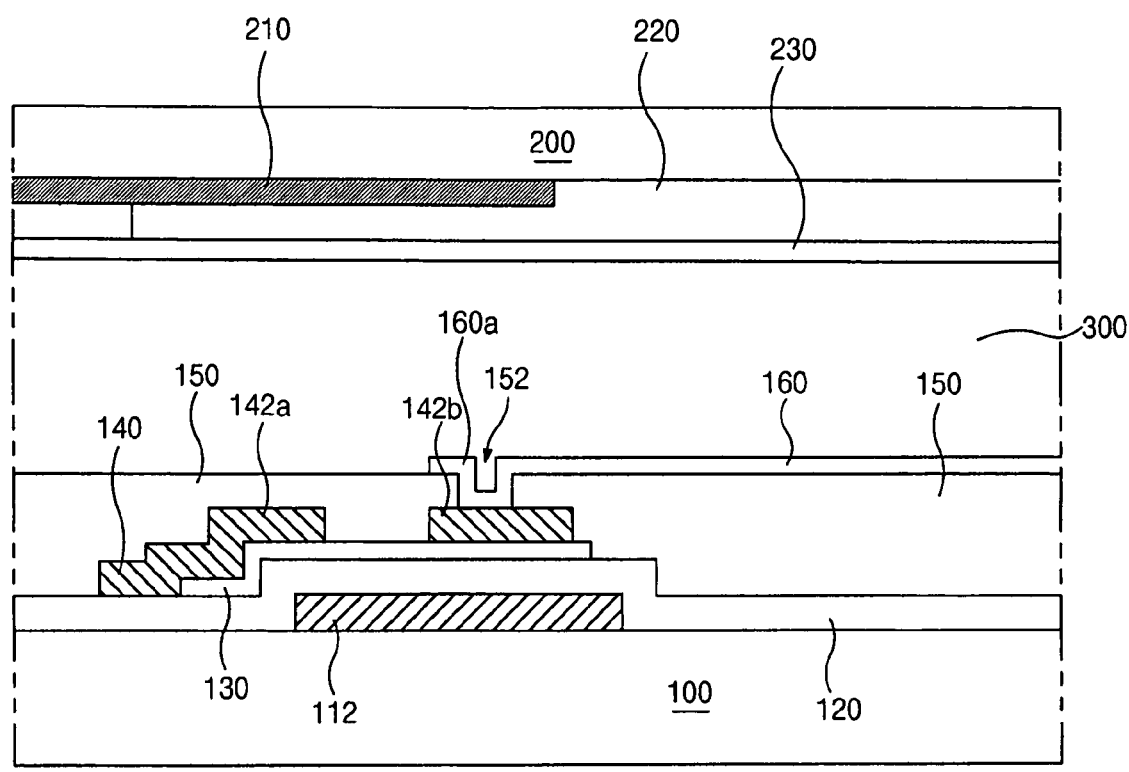
FIG. 6 is a schematic cross-sectional view of a liquid crystal display device including the array substrate according to the embodiment of the present invention.

FIG. 6 is a schematic cross-sectional view of a liquid crystal display device including the array substrate according to an embodiment of the present invention. Here, the explanation of the array substrate will be omitted.

As shown in FIG. 6, a transparent substrate 200 is spaced apart from and disposed over the array substrate 100. A black matrix 210 is formed on an inner surface of the substrate 200 and a color filter layer 220 is formed on the black matrix 210. The color filter layer 220 has three colors of red (R), green (G) and blue (B), and each color corresponds to each pixel area. A common electrode 230 is formed on the color filter layer 220.

A liquid crystal layer 300 is interposed between the pixel electrode 160 and the common electrode 230.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An array substrate for a liquid crystal display device, comprising:
   a substrate;
   a gate electrode on the substrate;
   a first insulating layer on the gate electrode;
   an active layer on the first insulating layer and corresponding to the gate electrode;
   a source electrode over the active layer and overlapping an edge of the active layer and forming a first parasitic capacitance between the source electrode and gate electrode;

a drain electrode over the active layer and having an island shape, wherein the drain electrode is enclosed by the source electrode and located entirely on the gate electrode and forms a second parasitic capacitance between the drain electrode and gate electrode;

a second insulating layer on the source and drain electrodes, and including a drain contact hole exposing the drain electrode; and a pixel electrode over the second insulating layer and connected to the drain electrode, wherein the source electrode has an opening located in an inner space towards a pixel region.

2. The array substrate according to claim 1, wherein the pixel electrode includes an extended portion covering the drain electrode, wherein a third parasitic capacitance is formed by the extended portion and the gate electrode.

3. The array substrate according to claim 2, wherein the extended portion contacts the drain electrode through the drain contact hole.

4. The array substrate according to claim 2, wherein the extended portion of the pixel electrode passes through the opening.

5. The array substrate according to claim 1, wherein the source electrode partially overlaps the gate electrode.

6. The array substrate according to claim 1, wherein the second insulating layer is made of benzocyclobutene (BCB).

7. The array substrate according to claim 1, further comprising an ohmic contact layer between the active layer and the source and drain electrodes.

8. A liquid crystal display device, comprising:

first and second substrates facing and spaced apart from each other;

a gate electrode on an inner surface of the first substrate;

a first insulating layer on the gate electrode;

an active layer on the first insulating layer and corresponding to the gate electrode;

a source electrode over the active layer and overlapping an edge of the active layer;

a drain electrode over the active layer and having an island shape, wherein the drain electrode is enclosed by the source electrode and located entirely on the gate electrode, wherein the drain electrode is spaced apart from the source electrode;

a second insulating layer on the source and drain electrodes, and including a drain contact hole exposing the drain electrode;

a pixel electrode over the second insulating layer and connected to the drain electrode via the drain contact hole;

a black matrix on an inner surface of the second substrate;

a color filter layer on the black matrix;

a common electrode on the color filter layer; and a liquid crystal layer between the pixel electrode and the common electrode, wherein the source electrode has an opening located in an inner space towards a pixel region.

9. The device according to claim 8, wherein the pixel electrode includes an extended portion covering the drain electrode.

10. The device according to claim 9, wherein the extended portion contacts the drain electrode through the drain contact hole.

11. The device according to claim 9, wherein the extended portion passes through the opening of the source electrode.

* * * * *